United States Patent

Haberstroh et al.

[11] Patent Number: 5,251,103
[45] Date of Patent: Oct. 5, 1993

[54] VEHICLE COMPONENT HOLDING CASE

[75] Inventors: Rudolf Haberstroh, Schonach; Wolfgang Rohde, Sindelfingen; Hans-Jürgen Meier, Höxter, all of Fed. Rep. of Germany

[73] Assignee: Mercedes-Benz A.G., Fed. Rep. of Germany

[21] Appl. No.: 912,264

[22] Filed: Jul. 13, 1992

[30] Foreign Application Priority Data

Jul. 13, 1991 [DE] Fed. Rep. of Germany ....... 4123261

[51] Int. Cl.5 ............................................. H05K 5/00
[52] U.S. Cl. .................................... 361/728; 220/3.3; 248/906; 361/730; 361/809
[58] Field of Search ................ 200/307; 220/3.3, 23.4; 174/52.1, 58; 439/32, 34, 529, 562-564, 569, 570, 573, 715, 717, 732; 248/221.2, 223.3, 225.31, 906, 911; 361/331, 334, 356, 380, 393-396, 412, 413, 417, 419, 420, 425-427

[56] References Cited

U.S. PATENT DOCUMENTS

| | | | |
|---|---|---|---|
| 3,564,112 | 2/1971 | Algotsson | 174/52.1 |
| 3,877,601 | 4/1975 | Evans | 220/3.3 |
| 3,920,309 | 11/1975 | Garver | 29/629 |
| 4,270,035 | 5/1981 | Richter, Sr. | 439/564 |
| 4,456,130 | 6/1984 | Possati | 211/26 |
| 4,576,302 | 3/1986 | Smolik | 220/3.3 |
| 4,948,317 | 8/1990 | Marinaro | 411/535 |
| 4,959,018 | 9/1990 | Yamamoto et al. | 174/52.1 |
| 4,989,118 | 1/1991 | Sorenson | 200/307 |
| 5,005,792 | 4/1991 | Rinderer | 248/906 |

FOREIGN PATENT DOCUMENTS 9100962 5/1991 Fed. Rep. of Germany.
2254260 7/1975 France.

Primary Examiner—Gerald P. Tolin
Attorney, Agent, or Firm—Evenson, McKeown, Edwards & Lenahan

[57] ABSTRACT

A casing for holding electronic components and the like, is provided on each of its side walls facing away from one another with two fastening lugs which project laterally therefrom and are each provided with an opening for the passage of a screw, and which are associated with casing side edges corresponding to one another. The openings for the passage of a screw which are provided in fastening lugs lying opposite one another and associated with the same side wall of the casing are in each case free from overlap, in their projection, with the fastening lug lying opposite. The arrangement of the fastening lugs makes possible the installation of the casing in both right-hand and left-hand drive vehicles without being mounted with mirror inversion. This provides advantages, for example, when there is restricted space to accommodate the cable leading out of the casing.

6 Claims, 2 Drawing Sheets

VEHICLE COMPONENT HOLDING CASE

BACKGROUND AND SUMMARY OF THE INVENTION

The present invention relates to a casing for holding components in vehicles, and, more particularly, to a case for holding electronic components, comprising two fastening lugs, each of which has a fastening opening and which project laterally from mutually corresponding side edges of opposite side walls of the casing.

Casings are used in vehicle construction for holding control equipment for vehicle electronics as shown, for example, in WO 86/06334). They are generally of flat, right parallelepipedic shape and can be fastened, via lugs which project laterally from opposite side walls of the casing, by one flat side of the casing to a mounting surface, such as an engine compartment side wall.

A sealingly inserted plug strip is provided on the wall lying at the top of the casing to receive a connection plug fitted to a connection cable. The space available for mounting the casing is often so restricted that the connection cable can lead out of the casing only in one predetermined lateral direction. This may give rise to problems if, as is customary, such casings are also intended for right-hand drive vehicles. In this situation, the casing is then installed in a mirror-inverted position, with the result that the connection cable which is to be coupled to the casing has to be taken out of the casing laterally in a direction in which often only inadequate space is available for this purpose.

Installation problems also arise when a plurality of casings of the type in question have to be installed parallel to one another or one behind the other. In this instance, an additional holder to be fastened on the vehicle is required for the installation of each further casing.

An object underlying the invention is to provide a casing which is suitable and equally advantageous for installation in left-hand and right-hand drive vehicles and which makes it possible for such casings to be mounted as a block without using additional holders acting between the casings.

This object has been achieved according to the present invention by providing, from opposite casing side walls carrying the first pair of fastening lugs, a second pair of fastening lugs provided with a fastening opening correspondingly project laterally on the casing side edge which each lays opposite the respective first pair of fastening lugs, and the fastening openings of the two pairs of fastening lugs associated with a casing side wall each lays free from overlap, in a projection through the openings, with respect the opening fastening lug on the same casing wall.

The construction according to the invention is thus distinguished by fastening lugs which project laterally in pairs from opposite side walls of the casing. The fastening lugs provided on the same casing wall are each associated with one another such that the openings provided for the passage of screws are each free from overlap, in their projection, with the fastening lug lying opposite.

It is thus possible, e.g. for installation in right-hand drive vehicles, to mount the casing in the same position as in left-hand drive vehicles, i.e. without mirror inversion, with the sole difference being that in the two types of vehicle a different flat side of the casing will face the respective casing mounting. In both types of vehicle, the connection cable can thus be taken out of the casing in the same direction.

If a plurality of casings are to be disposed one behind the other, fastening lugs on neighboring casings can be brought into line with one another and bolted together. In this situation the casings lay one against the other at least on a part of their flat sides which face one another, so that a compact block of casings can be formed.

An advantageous feature of the present invention also results from the mutual offsetting of the fastening lugs lying opposite one another on a common side wall of the casing because there results a large free space for the insertion of fastening screws into openings provided for the passage of the screws and also for the application of appropriate screw tools.

Another advantageous feature of the invention is that, when the casing is in the fastened state, its side wall facing the mounting surface is held in contact therewith, and thus good transmission of heat from the casing to the mounting surface is ensured.

The present invention also offers the advantage that, depending on the space available for its installation, the casing can, if necessary, also be screwed from above to a mounting surface.

A further feature of the present invention offers the advantage that, for the purpose of dissipating heat from the casing, a flat side of the casing can be held in contact with a contact surface even when fastening lugs cannot be used for screwing the casing in place, e.g. because of an obstruction from above.

BRIEF DESCRIPTION OF THE DRAWINGS

These and further objects, features and advantages of the present invention will become more readily apparent from the following detailed description of currently preferred embodiments when taken in conjunction with the accompanying drawings wherein.

DETAILED DESCRIPTION OF THE DRAWINGS

Figure 1:
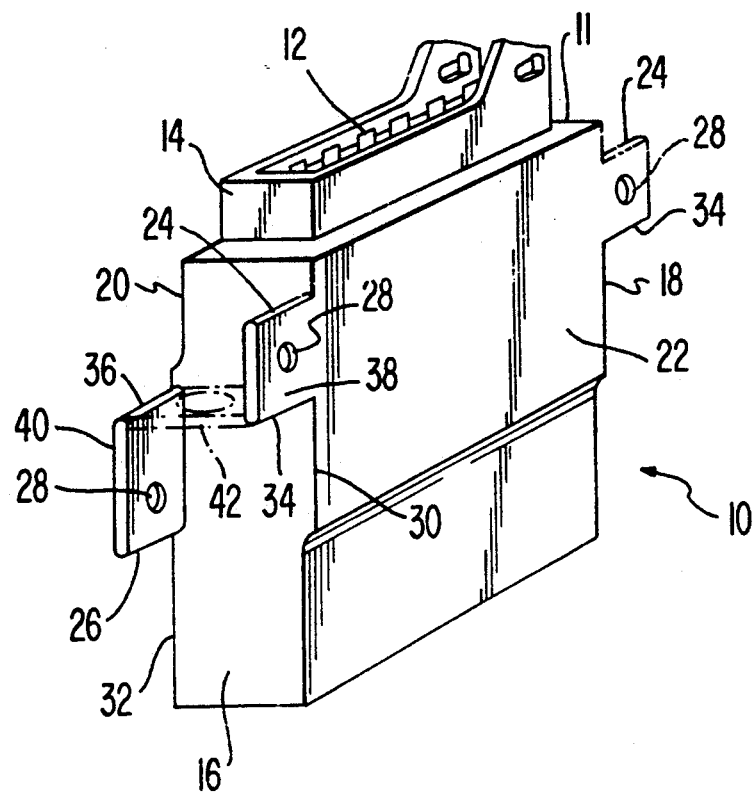
FIG. 1 is a perspective view of a first embodiment of a casing in accordance with the present invention.

FIG. 1 shows a casing 10, for holding, for example, control equipment for vehicle electronics and having for exemplary purposes the shape of a flat parallelepiped. A plug strip 12 is sealingly inserted into a top casing wall and is surrounded by a socket 14 to which a cable plug can be connected. Shorter casing side walls lying opposite one another are designated by numerals 16 and 18, while the front and rear flat sides of the casing are designated by numerals 20 and 22.

Figure 2:
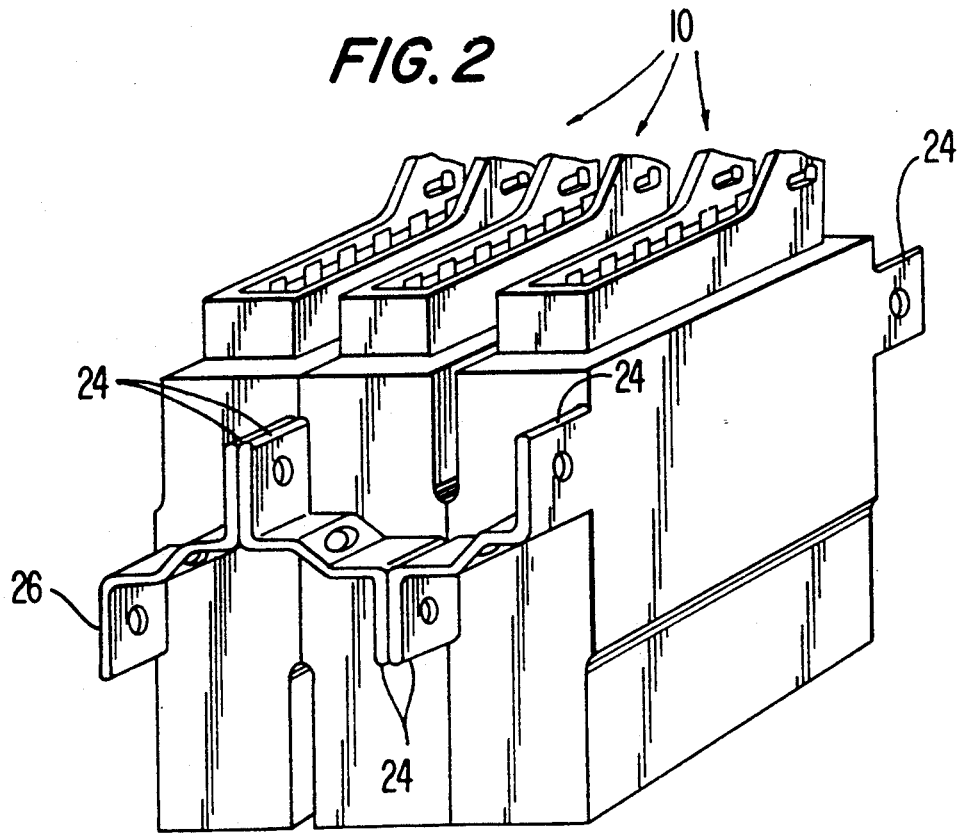
FIG. 2 is a perspective view of several casings of a second embodiment of the present invention joined together to form a block.
Figure 3:
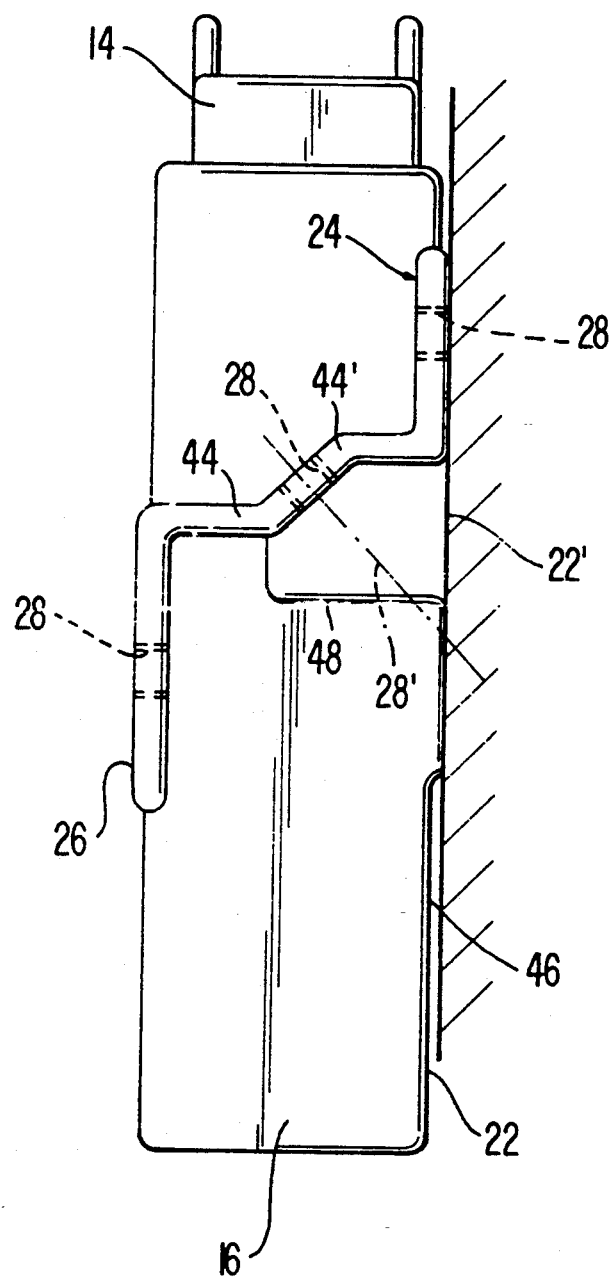
FIG. 3 is a perspective view of the second embodiment of the casing in accordance with the present invention shown in FIG. 2.

Each side wall 16 or 18 of the casing has associated with it a pair of fastening lugs 24 and 26 which project laterally therefrom and in each of which is provided a hole 28 for the passage of a screw. One of the fastening lugs 24 or 26 is allocated to each casing side edge 30, 32 bounding the casing side walls 16 and 18. The fastening lugs 24, 26 are offset relative to each other, e.g. such that the bottom edge 34 of one fastening lug 24 and the top edge 36 of the other fastening lug 26 are situated approximately in a common horizontal plane. In the illustrated embodiment of FIG. 1, the fastening lugs 24, 26 have the same dimensions at their edges; however, these dimensions may also be different as seen in the embodiment of FIGS. 2 and 3. One flat side 38 or 40 of the fastening lugs 24 and 26 merges planarly into the adjoining flat side 20 or 22 of the casing.

The arrangement of the fastening lugs 24, 26 explained above makes it possible for the casing 10 to be screwed in position in left-hand and right-hand drive vehicles in the same position, e.g. in the engine compartment of a vehicle, on an appropriate mounting surface. Intimate contact promoting the flow of heat out of the casing is thereby ensured between the mounting surface and the facing casing flat side 20 or 22.

As indicated in dot-dash lines in FIG. 1, the fastening lugs 24 and 26 lying opposite one another may have associated with them a web 42 which is provided with an opening for a screw and which for example extends at right angles to the fastening lugs 24 and 26. This provides another possible method of fastening in cases where the fastening lugs 24 and 26 cannot be used for that purpose. The web 42 is preferably, in that alternative embodiment, joined to the fastening lugs 24 and 26.

FIG. 3 shows a stepped construction of a web 44, in which the stepped middle portion 44' of the web is provided with the opening 28 for a screw and extends obliquely to the fastening lugs 24 and 26 such that the axis 28' of the opening 28 forms an acute angle with the flat side 22 of the casing. This angle should be selected so that the axis 28' of the opening 28 for the passage of a screw passes through that portion 22' of the casing flat side 22 which can be laid against a mounting surface. A force component ensuring reliable contact at the contact surface concerned, in particular for the dissipation of heat, will then act on the fastening of the casing.

For the fastening of the casing by way of webs 42 or 44, appropriate screw-on bases 48 should then be provided on the casing contact surface 46 in question, as indicated in dot-dash lines in FIG. 3.

The web arrangement enables the fastening of the casing to be carried out advantageously, for example when the site for the installation of the casing 10 is obstructed from above and therefore access for a tool to fasten screws passing through the fastening lugs 24 or 26 is difficult or impossible. The stepped web arrangement permits access to such fastening screws even when a screw tool cannot be applied vertically.

In connection with the web arrangement, a further embodiment may also consist in providing on the casing side walls 16, 18 only an inclined web corresponding approximately to the middle web portion 44'.

FIG. 2 illustrates how the provision of fastening lugs 24 and 26 according to the present invention on identical casings 10 enables such casings 10 to be combined to form a block. It is thus unnecessary to use additional connection elements, such as holders, which have to be specially fitted to mounting surfaces independently of neighboring casings.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. A casing comprising means for holding components, including electronic components, in a vehicle and having opposite side walls, comprising first and second fastening lugs each having a fastening opening and projecting laterally from respective first and second edges on one of the opposite side walls in a plane of one of the sidewalls, and third and fourth fastening lugs each having a fastening opening and projecting laterally from respective third and fourth edges on another of the opposite side walls in a plane of the another sidewall, wherein axes through the fastening openings of the first and third fastening lugs projecting from the first and third edges at a first side of the casing and axes through the fastening openings of the second and fourth fastening lugs projecting from the second and fourth edges at a second side of the casing are offset with respect to one another.

2. The casing according to claim 1, wherein fastening lugs at opposite edges of the same casing end are associated, as projected toward one another, without overlap.

3. The casing according to claim 1, wherein one flat side through each fastening lug merges in a planar fashion into a respective casing side wall.

4. The casing according to claim 1, wherein a web provided with a fastening opening is disposed between the opposed fastening lugs projecting from the same casing end.

5. The casing according to claim 1, wherein at least a portion of a web extends obliquely between the fastening lugs and is provided with a fastening opening.

6. The casing according to claim 1, wherein a web is joined at least to one of the fastening lugs.

* * * * *